United States Patent
Lee et al.

(10) Patent No.: US 12,389,720 B2
(45) Date of Patent: Aug. 12, 2025

(54) DISPLAY DEVICE AND METHOD OF MANUFACTURING LIGHT-EMITTING ELEMENT

(71) Applicant: Samsung Display Co., LTD., Yongin-si (KR)

(72) Inventors: So Young Lee, Yongin-si (KR); Dong Uk Kim, Yongin-si (KR); Chul Jong Yoo, Yongin-si (KR); Se Young Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 481 days.

(21) Appl. No.: 17/389,127

(22) Filed: Jul. 29, 2021

(65) Prior Publication Data
US 2022/0173277 A1    Jun. 2, 2022

(30) Foreign Application Priority Data
Dec. 2, 2020 (KR) .................. 10-2020-0167027

(51) Int. Cl.
*H10H 20/84* (2025.01)
*H01L 25/075* (2006.01)
(Continued)

(52) U.S. Cl.
CPC .......... *H10H 20/84* (2025.01); *H01L 25/0753* (2013.01); *H01L 25/167* (2013.01);
(Continued)

(58) Field of Classification Search
CPC ............... H01L 25/0753; H01L 25/167; H01L 2933/0025; H01L 33/007; H01L 33/0075;
(Continued)

(56) References Cited

U.S. PATENT DOCUMENTS

| | | | |
|---|---|---|---|
| 8,134,163 B2 | 3/2012 | Yu et al. | |
| 10,418,510 B1* | 9/2019 | Oyer | H01L 33/20 |
| 10,818,820 B2 | 10/2020 | Kim | |
| 11,810,905 B2 | 11/2023 | Cho et al. | |
| 2016/0254138 A1 | 9/2016 | Kikuchi et al. | |
| 2017/0133550 A1* | 5/2017 | Schuele | H01L 25/167 |

(Continued)

FOREIGN PATENT DOCUMENTS

| | | |
|---|---|---|
| EP | 2 704 215 B1 | 4/2018 |
| KR | 10-2015-0008593 | 1/2015 |

(Continued)

OTHER PUBLICATIONS

International Search Report issued Jan. 17, 2022 in International Application No. PCT/KR2021/014137, 3 pages.

*Primary Examiner* — Matthew C Landau
*Assistant Examiner* — Dmitriy Yemelyanov
(74) *Attorney, Agent, or Firm* — Womble Bond Dickinson (US) LLP

(57) ABSTRACT

A display device, a light-emitting element, and a method of manufacturing a light-emitting element are provided. A display device includes: a first electrode and a second electrode spaced apart from each other; and light-emitting elements between the first electrode and the second electrode, and each of the light-emitting elements includes a first area having a first diameter, a second area having a second diameter greater than the first diameter, a first insulating film surrounding the first area, and a second insulating film on the first insulating film, and the second insulating film surrounds the second area exposed by the first insulating film.

4 Claims, 15 Drawing Sheets

(51) Int. Cl.
    *H01L 25/16*     (2023.01)
    *H10H 20/01*     (2025.01)
    *H10H 20/819*     (2025.01)

(52) U.S. Cl.
    CPC ............... *H10H 20/01335* (2025.01); *H10H 20/0137* (2025.01); *H10H 20/819* (2025.01); *H10H 20/018* (2025.01); *H10H 20/034* (2025.01)

(58) Field of Classification Search
    CPC ..... H01L 33/0093; H01L 33/20; H01L 33/24; H01L 33/44; H01L 33/62
    See application file for complete search history.

(56) References Cited

U.S. PATENT DOCUMENTS

| | | | |
|---|---|---|---|
| 2017/0162091 A1* | 6/2017 | Wu | ............... H01L 27/156 |
| 2017/0373228 A1 | 12/2017 | Chang et al. | |
| 2018/0374991 A1 | 12/2018 | Bour et al. | |
| 2020/0251460 A1* | 8/2020 | Iguchi | ............... H01L 27/156 |
| 2021/0202450 A1 | 7/2021 | Min et al. | |

FOREIGN PATENT DOCUMENTS

| | | |
|---|---|---|
| KR | 10-2019-0120467 A | 10/2019 |
| KR | 10-2020-0021014 A | 2/2020 |
| KR | 10-2020-0029100 A | 3/2020 |
| TW | 201007987 A1 | 2/2010 |
| WO | WO 2020/036271 A1 | 2/2020 |
| WO | WO 2020/050468 A1 | 3/2020 |

* cited by examiner

DISPLAY DEVICE AND METHOD OF MANUFACTURING LIGHT-EMITTING ELEMENT

CROSS-REFERENCE TO RELATED APPLICATION

This application claims priority to and the benefit of Korean Patent Application No. 10-2020-0167027, filed on Dec. 2, 2020 in the Korean Intellectual Property Office, the entire content of which is incorporated herein by reference.

BACKGROUND

1. Field

Aspects of embodiments of the present invention relate to a display device, a light-emitting element, and a method of manufacturing a light-emitting element.

2. Description of the Related Art

Recently, as interest in information displays is increasing, research and development for display devices are continuously being conducted.

SUMMARY

According to an aspect of embodiments of the present invention, a method of manufacturing a light-emitting element, which is capable of minimizing or reducing surface defects of a light-emitting element, and a display device, are provided.

However, aspects of the present invention are not limited to those described above, and other aspects will be obvious to the persons having an ordinary knowledge in this field from the following descriptions.

According to one or more embodiments, a display device includes: a first electrode and a second electrode spaced apart from each other; and light-emitting elements between the first electrode and the second electrode, wherein each of the light-emitting elements includes a first area having a first diameter, a second area having a second diameter greater than the first diameter, a first insulating film surrounding the first area, and a second insulating film on the first insulating film, and the second insulating film surrounds the second area exposed by the first insulating film.

Each of the light-emitting element may further include a first semiconductor layer, a second semiconductor layer on the first semiconductor layer, and an active layer between the first semiconductor layer and the second semiconductor layer, and the active layer may be in the first area.

The first semiconductor layer may be in the first area.

The first semiconductor layer may include a p-type semiconductor layer.

The first insulating film may directly cover the first semiconductor layer, the active layer, and the second semiconductor layer in the first area.

The second insulating film may directly cover the second semiconductor layer in the second area exposed by the first insulating film.

The display device may further include: a first contact electrode electrically connecting the first electrode and the first semiconductor layer; and a second contact electrode electrically connecting the second electrode and the second semiconductor layer.

The first contact electrode may be in contact with the first semiconductor layer exposed by the second insulating film, and the second contact electrode may be in contact with the second semiconductor layer exposed by the second insulating film.

At least one of a side surface of the first area and a side surface of the second area of the light-emitting element may include an inclined portion.

According to one or more embodiments, a light-emitting element includes: a first area having a first diameter; a second area having a second diameter greater than the first diameter; a first insulating film surrounding the first area; and a second insulating film surrounding the second area exposed by the first insulating film.

The light-emitting element may further include: a first semiconductor layer; a second semiconductor layer on the first semiconductor layer; and an active layer between the first semiconductor layer and the second semiconductor layer, wherein the active layer has the first diameter.

The first insulating film may directly cover the first semiconductor layer, the active layer, and the second semiconductor layer in the first area.

The second insulating film may directly cover the second semiconductor layer in the second area exposed by the first insulating film.

At least one of a side surface of the first area and a side surface of the second area may include an inclined portion.

The first insulating film may directly cover the inclined portion of the first area.

The second insulating film may directly cover the inclined portion of the second area.

The first insulating film and the second insulating film may include a same material.

The light-emitting element may further include a third insulating film on the first insulating film and the second insulating film.

The first insulating film and the second insulating film may include different materials.

According to one or more embodiments, a method of manufacturing a light-emitting element includes: forming a light-emitting stack on a stack substrate; primary etching the light-emitting stack to form first areas of light-emitting patterns; forming a first insulating film surrounding the first areas of the light-emitting patterns; and secondary etching the light-emitting patterns to form second areas of the light-emitting patterns, wherein a diameter of the second area of the light-emitting patterns is greater than a diameter of the first area thereof.

The light-emitting stack may include: a first semiconductor layer; a second semiconductor layer on the first semiconductor layer; and an active layer between the first semiconductor layer and the second semiconductor layer.

In the forming of the first area, the first semiconductor layer and the active layer may be etched.

The first insulating film may be formed directly on the first semiconductor layer and the active layer.

The method may further include surface-treating the first area or the second area.

The method may further include forming a second insulating film surrounding the first area and the second area.

The method may further include removing the first insulating film after the forming of the second area.

The method may further include forming a third insulating film surrounding the first area and the second area.

The method may further include forming a fourth insulating film on the third insulating film.

Further detailed descriptions of the embodiments are included in the below detailed description and the drawings.

DETAILED DESCRIPTION

Figure 1:
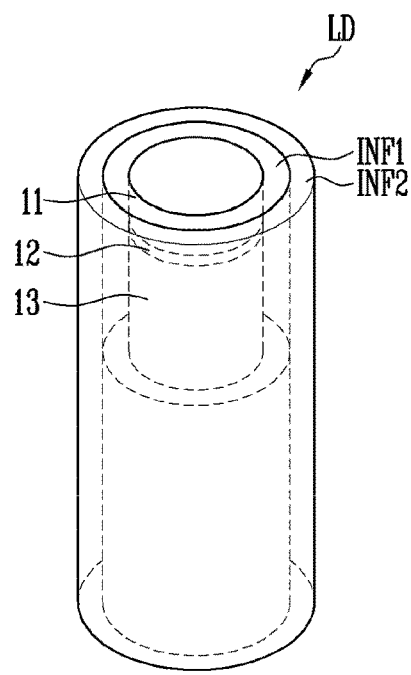
FIGS. 1 and 2 are a perspective view and a cross-sectional view, respectively, illustrating a light-emitting element according to an embodiment.

Aspects, advantages, and features of the present invention and methods of achieving the same will be described more fully with reference to the accompanying drawings, in which some embodiments of the invention are shown. However, the scope of the present invention is not limited to the embodiments set forth herein and the present invention may be realized in various forms. The embodiments are merely provided to make the disclosure of the present invention complete and to allow those having ordinary knowledge in the art to which the present invention pertains completely understand the scope of the present invention. The present invention is defined by the scope of the claims.

The terms used in the present specification are for explaining the embodiments, rather than limiting the present invention. As used herein, the singular forms "a," "an," and "the" are intended to include the plural forms as well, unless the context clearly indicates otherwise. It is to be further understood that the terms "comprises," "comprising," "includes," and/or "including," if used herein, specify the presence of stated components, steps, operations, and/or elements, but do not preclude the presence or addition of one or more other components, steps, operations, and/or elements.

In addition, the terms "connection" or "coupling" may mean a physical and/or electrical connection or coupling. Further, the terms may mean a direct or indirect connection or coupling and an integral or non-integral connection or coupling.

It is to be understood that when an element or a layer is referred to as being "on" or "above" another element or layer, it may be directly on or above another element or layer or one or more intervening elements or layers may be present. Like reference numerals refer to like elements throughout the specification.

It is to be understood that, although terms such as "first," "second," and the like may be used herein to describe various components, these components are not limited by these terms. These terms are used to distinguish one element or component from another element or component. Therefore, a first component described below could be termed a second component without departing from the scope and spirit of the present disclosure.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, some embodiments of the present invention will be described in further detail with reference to the accompanying drawings.

Figure 2:
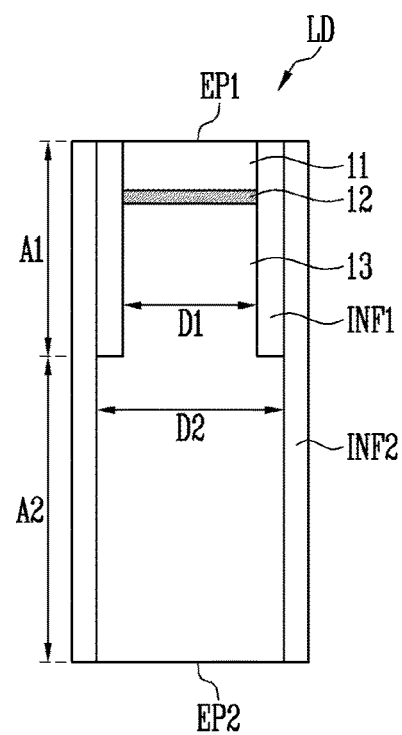

FIGS. 1 and 2 are a perspective view and a cross-sectional view, respectively, illustrating a light-emitting element according to an embodiment. A column-shaped light-emitting element LD is illustrated in FIGS. 1 and 2, but the type and/or shape of the light-emitting element LD are not limited thereto.

Referring to FIGS. 1 and 2, the light-emitting element LD may include a first semiconductor layer 11, an active layer 12, and a second semiconductor layer 13. As an example, the light-emitting element LD may include the first semiconductor layer 11, the active layer 12, and the second semiconductor layer 13 which are sequentially stacked in a direction.

The light-emitting element LD may be formed in a columnar shape extending in a direction. The light-emitting element LD may have a first end portion EP1 and a second end portion EP2. One of the first and second semiconductor layers 11 and 13 may be disposed at the first end portion EP1 of the light-emitting element LD. The other of the first and second semiconductor layers 11 and 13 may be disposed at the second end portion EP2 of the light-emitting element LD.

According to embodiments, the light-emitting element LD may be a light-emitting element manufactured in a columnar shape through an etching method or the like. In the present specification, the term "columnar shape" includes both a rod-like shape and a bar-like shape, such as a circular column and a polygonal column, which have an aspect ratio greater than one. A shape of a cross-section of the columnar shape is not limited.

The light-emitting element LD may have a small size in a range from a nanometer scale to a micrometer scale. As an example, the light-emitting element LD may have a diameter (or width) and/or a length which are in a range from a nanometer scale to a micrometer scale. However, the size of the light-emitting element LD is not limited thereto. The size of the light-emitting element LD may be variously changed according to design conditions of various devices, for example, a display device which uses a light-emitting device including the light-emitting element LD as a light source.

The first semiconductor layer 11 may be a first-conductivity type semiconductor layer. For example, the first semiconductor layer 11 may include a p-type semiconductor layer. As an example, the first semiconductor layer 11 may include a p-type semiconductor layer which includes any semiconductor material selected from InAlGaN, GaN, AlGaN, InGaN, AlN, and InN and is doped with a first-conductivity type dopant, such as magnesium (Mg). However, a material constituting the first semiconductor layer 11 is not limited thereto, and the first semiconductor layer 11 may be made of any of various materials.

The active layer 12 may be disposed between the first semiconductor layer 11 and the second semiconductor layer 13 and may be formed to have a single-quantum well or multi-quantum well structure. The position of the active layer 12 may be variously changed according to the type of the light-emitting element LD. A clad layer (not shown) doped with a conductive dopant may be formed on and/or under the active layer 12. As an example, the clad layer may be made of AlGaN or InAlGaN. According to embodiments, a material such as AlGaN or InAlGaN may be used to form the active layer 12, and, in addition, any of various materials may constitute the active layer 12.

The second semiconductor layer 13 may be disposed on the active layer 12 and may include a semiconductor layer which is a different type from the first semiconductor layer 11. In an embodiment, the second semiconductor layer 13 may include an n-type semiconductor layer. As an example, the second semiconductor layer 13 may include an n-type semiconductor layer which includes any semiconductor material selected from InAlGaN, GaN, AlGaN, InGaN, AlN, and InN and is doped with a second-conductivity type dopant, such as silicon (Si), germanium (Ge), tin (Sn), or the like. However, a material constituting the second semiconductor layer 13 is not limited thereto, and the second semiconductor layer 13 may be made of any of various materials.

When a voltage greater than or equal to a threshold voltage is applied to both end portions of the light-emitting element LD, electrons and holes are combined with each other in the active layer 12, and, thus, the light-emitting element LD emits light. By controlling light emission of the light-emitting element LD using such a principle, the light-emitting element LD may be used as a light source of any of various light-emitting devices including pixels of a display device.

The light-emitting element LD may include a first area A1 and a second area A2 having different diameters. In an embodiment, the first area A1 may have a first diameter D1, and the second area A2 may have a second diameter D2 that is greater than the first diameter D1. Here, the diameters D1 and D2 may refer to average diameters of the areas A1 and A2, respectively. A difference in diameter between the first area A1 and the second area A2 may occur when the areas A1 and A2 are sequentially etched in a process of manufacturing the light-emitting element LD. This will be described in further detail below with reference to FIGS. 13 to 20.

In an embodiment, the first semiconductor layer 11 and/or the active layer 12 may be disposed in the first area A1. The second semiconductor layer 13 may be disposed in the second area A2. That is, the first semiconductor layer 11 may have the first diameter D1, the active layer 12 may have the first diameter D1, and the second semiconductor layer 13 may have the second diameter D2. In addition, an area of the first semiconductor layer 11 at the first end portion EP1 may be smaller than an area of the second semiconductor layer 13 at the second end portion EP2. According to embodiments, a portion of the second semiconductor layer 13 may be further disposed in the first area A1. In this case, the second semiconductor layer 13 in the first area A1 may have the first diameter D1, and the second semiconductor layer 13 in the second area A2 may have the second diameter D2. However, the present invention is not limited thereto, and the relative positions of the first semiconductor layer 11, the active layer 12, and/or the second semiconductor layer 13 may be variously changed.

The light-emitting elements LD may further include a first insulating film INF1 and a second insulating film INF2 formed on a surface thereof. In an embodiment, the first insulating film INF1 may be partially formed only in the first area A1. For example, the first insulating film INF1 may be formed to surround the first area A1. In an embodiment, the first insulating film INF1 may be disposed directly on surfaces of the first semiconductor layer 11, the active layer 12, and/or the second semiconductor layer 13 of the first area A1. The first insulating film INF1 may expose the first and second end portions EP1 and EP2 of the light-emitting element LD having different polarities. In an embodiment, the first insulating film INF1 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). When the first insulating film INF1 is formed on the first area A1, it is possible to prevent or substantially prevent damage to the active layer 12 of the first area A1 in a process of etching the second area A2, and the surface defects of the light-emitting element LD can be minimized or reduced to improve the lifetime and efficiency thereof.

The second insulating film INF2 may be disposed on the first insulating film INF1. The second insulating film INF2 may be disposed to surround the first insulating film INF1. In an embodiment, the second insulating film INF2 may be disposed directly on a surface of the first insulating film INF1. In addition, the second insulating film INF2 may be formed to surround the second area A2 exposed by the first insulating film INF1. In an embodiment, the second insulating film INF2 may be disposed directly on the surface of the second semiconductor layer 13 of the second area A2 exposed by the first insulating film INF1. The second insulating film INF2 may expose the first and second end portions EP1 and EP2 of the light-emitting element LD having different polarities.

In an embodiment, the second insulating film INF2 may include the same material as the first insulating film INF1 described above. For example, the second insulating film INF2 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). When the first insulating film INF1 and the second insulating film INF2 are made of the same material, the insulating films INF1 and INF2 having different thicknesses may be formed in the first area A1 and the second area A2. For example, the insulating films INF1 and INF2 of the first area A1 may be thicker than the insulating film INF2 of the second area A2.

In another embodiment, the second insulating film INF2 may include a material different from that of the first insulating film INF1. When the first insulating film INF1 and the second insulating film INF2 are made of different materials, a double-insulating film may be formed in the first area A1, and a single-insulating film may be formed in the second area A2. When the second insulating film INF2 is formed on the first insulating film INF1, the active layer 12 may be prevented or substantially prevented from being short-circuited with at least one electrode (for example, at least one contact electrode of contact electrodes connected to both end portions of the light-emitting element LD). Accordingly, the electrical stability of the light-emitting element LD can be secured.

According to embodiments, the light-emitting element LD may further include additional components in addition to the first semiconductor layer 11, the active layer 12, the second semiconductor layer 13, and/or the insulating films INF1 and INF2 surrounding the first semiconductor layer 11, the active layer 12, and the second semiconductor layer 13. For example, an electrode layer may be further disposed at each of the first and second end portions EP1 and EP2 of the light-emitting element LD. The electrode layer may include a transparent metal or a transparent metal oxide. As an example, the electrode layer may include at least one selected from indium tin oxide (ITO), indium zinc oxide (IZO), zinc oxide (ZnO), and zinc tin oxide (ZTO), but the present invention is not limited thereto.

In FIGS. 1 and 2, the column-shaped light-emitting element LD is illustrated, but the type, structure, and/or shape of the light-emitting element LD may be variously changed. For example, the light-emitting element LD may be formed in a core-shell structure having a polypyramid shape.

A light-emitting device including the light-emitting element LD described above may be used in various types of devices including a display device, which require a light source. For example, a plurality of light-emitting elements LD may be disposed in each pixel of a display panel, and the light-emitting element LD may be used as a light source of each pixel. However, an application field of the light-emitting element LD is not limited to the above-described example. For example, the light-emitting element LD may be used in other types of devices, such as a lighting device, which require a light source.

Herein, some other embodiments will be described. In the following embodiments, the same components as the above-described components will be denoted by the same reference numerals, and repetitive descriptions thereof may be omitted or simplified.

Figure 3:
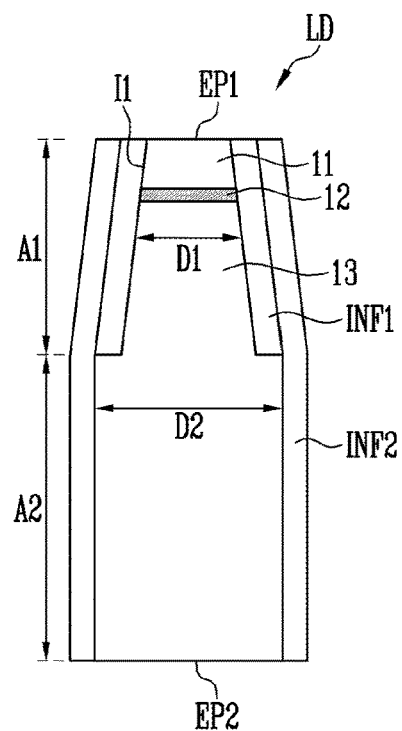
FIG. 3 is a cross-sectional view illustrating a light-emitting element according to another embodiment.

FIG. 3 is a cross-sectional view illustrating a light-emitting element according to another embodiment.

Referring to FIG. 3, a light-emitting element LD according to the present embodiment is distinguished from the embodiment of FIGS. 1 and 2 in that a side surface of a first area A1 includes an inclined portion I1. For example, side surfaces of a first semiconductor layer 11 and/or an active layer 12 in the first area A1 may include the inclined portion I1. According to embodiments, a side surface of a second semiconductor layer 13 in the first area A1 may include the inclined portion I1. Since the side surface of the first area A1 includes the inclined portion I1 having an inclination (e.g., a predetermined inclination), the first area A1 may have a shape of which a first diameter D1 is gradually decreased toward a first end portion EP1. As described above, when the side surface of the first area A1 includes the inclined portion I1, the first end portion EP1 and a second end portion EP2 may be easily distinguished through the inclined portion I1 of the first area A1 such that whether the light-emitting element LD is deflected and aligned may be determined using an optical inspection device. In addition, since the first semiconductor layer 11, the active layer 12, the second semiconductor layer 13, a first insulating film INF1, and a second insulating film INF2 of the light-emitting element LD have been described with reference to FIGS. 1 and 2, redundant descriptions thereof are omitted.

Figure 4:
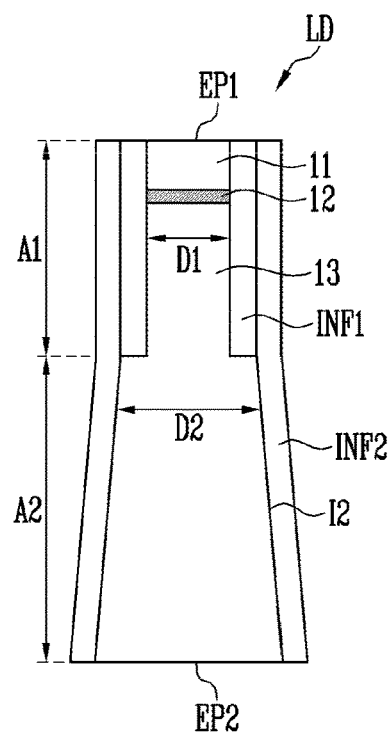
FIG. 4 is a cross-sectional view illustrating a light-emitting element according to another embodiment.

FIG. 4 is a cross-sectional view illustrating a light-emitting element according to another embodiment.

Referring to FIG. 4, a light-emitting element LD according to the present embodiment is distinguished from the embodiment of FIGS. 1 and 2 in that a side surface of a second area A2 includes an inclined portion I2. For example, a side surface of a second semiconductor layer 13 in the second area A2 may include the inclined portion I2. Since the side surface of the second area A2 includes the inclined portion I2 having an inclination (e.g., a predetermined inclination), the second area A2 may have a shape of which a second diameter D2 is gradually increased toward a second end portion EP2. As described above, when the side surface of the second area A2 includes the inclined portion I2, a first end portion EP1 and the second end portion EP2 may be easily distinguished through the inclined portion I2 of the second area A2 such that whether the light-emitting element LD is deflected and aligned may be determined using an optical inspection device.

Figure 5:
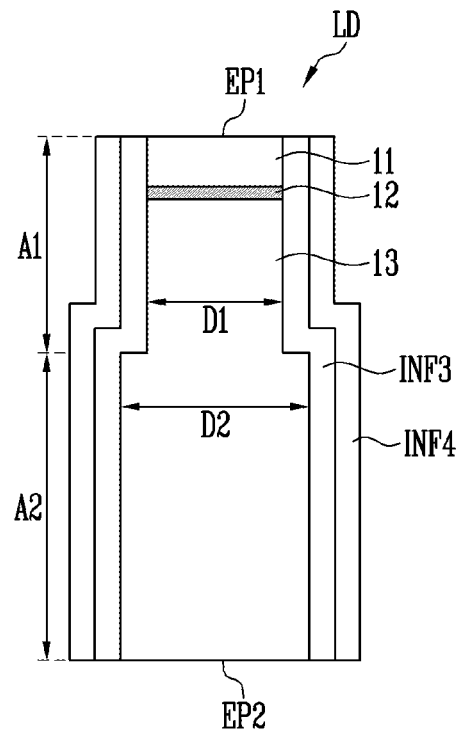
FIG. 5 is a cross-sectional view illustrating a light-emitting element according to another embodiment.

FIG. 5 is a cross-sectional view illustrating a light-emitting element according to another embodiment.

Referring to FIG. 5, a light-emitting element LD according to the present embodiment is distinguished from the embodiment of FIGS. 1 and 2 in that the light-emitting element LD includes a third insulating film INF3 and a fourth insulating film INF4 which surround a first area A1 and a second area A2. The third insulating film INF3 may be formed to surround the first area A1 and the second area A2. In an embodiment, the third insulating film INF3 may be disposed directly on surfaces of a first semiconductor layer 11, an active layer 12, and/or a second semiconductor layer 13 in the first area A1 and the second area A2. The third insulating film INF3 may expose the first and second end portions EP1 and EP2 of the light-emitting element LD having different polarities. In an embodiment, the third insulating film INF3 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$).

The fourth insulating film INF4 may be disposed on the third insulating film INF3. The fourth insulating film INF4 may be disposed to surround the third insulating film INF3. In an embodiment, the fourth insulating film INF4 may be disposed directly on a surface of the third insulating film INF3. The fourth insulating film INF4 may expose the first and second end portions EP1 and EP2 of the light-emitting element LD having different polarities. In an embodiment, the fourth insulating film INF4 may include the same material as the third insulating film INF3. For example, the fourth insulating film INF4 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). However, the present invention is not necessarily limited thereto, and the fourth insulating film INF4 may include a material different from that of the third insulating film INF3.

The third insulating film INF3 and the fourth insulating film INF4 may each have different inner diameters in the areas A1 and A2 due to a difference in diameter between the first area A1 and the second area A2. For example, an inner diameter of the third insulating film INF3 in the first area A1 may be smaller than an inner diameter of the third insulating film INF3 in the second area A2. Similarly, an inner diameter of the fourth insulating film INF4 in the first area A1 may be smaller than an inner diameter of the fourth insulating film INF4 in the second area A2.

Figure 6:
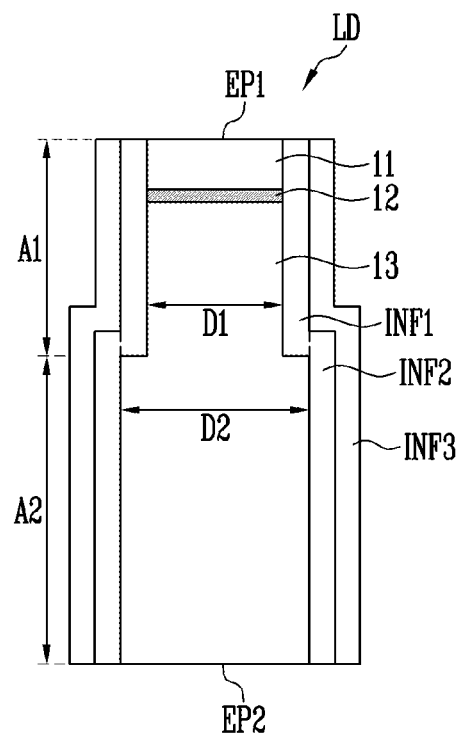
FIG. 6 is a cross-sectional view illustrating a light-emitting element according to another embodiment.

FIG. 6 is a cross-sectional view illustrating a light-emitting element according to another embodiment.

Referring to FIG. 6, a light-emitting element LD according to the present embodiment is distinguished from the embodiment of FIGS. 1 and 2 in that the light-emitting element LD includes a first insulating film INF1 and a second insulating film INF2 which respectively surround a first area A1 and a second area A2.

In an embodiment, the first insulating film INF1 may be disposed directly on surfaces of a first semiconductor layer 11, an active layer 12, and/or a second semiconductor layer 13 of the first area A1. In an embodiment, the first insulating film INF1 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$).

In an embodiment, the second insulating film INF2 may be disposed directly on a surface of the second semiconductor layer 13 of the second area A2. In an embodiment, the second insulating film INF2 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). According to embodiments, the second insulating film INF2 may include the same material as the first insulating film INF1. In this case, the first insulating film INF1 and the second insulating film INF2 may be concurrently (e.g., simultaneously) formed in a same process, but the present invention is not limited thereto.

A third insulating film INF3 may be disposed on the first insulating film INF1 and the second insulating film INF2. The third insulating film INF3 may be disposed to surround the first insulating film INF1 and the second insulating film INF2. In an embodiment, the third insulating film INF3 may be disposed directly on surfaces of the first insulating film INF1 and the second insulating film INF2. The third insulating film INF3 may expose first and second end portions EP1 and EP2 of the light-emitting element LD having different polarities. In an embodiment, the third insulating film INF3 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$).

Figure 7:
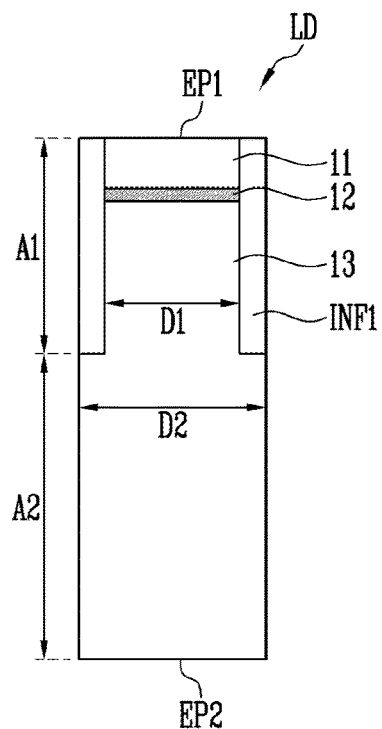
FIG. 7 is a cross-sectional view illustrating a light-emitting element according to another embodiment.

FIG. 7 is a cross-sectional view illustrating a light-emitting element according to another embodiment.

Referring to FIG. 7, a light-emitting element LD according to the present embodiment is distinguished from the embodiment of FIGS. 1 and 2 in that a second insulating film INF2 is omitted. Since the second insulating film INF2 is omitted, not only a second end portion EP2 of the light-emitting element LD, but also a side surface of a second area A2 may be exposed. That is, a side surface of a second semiconductor layer 13 in the second area A2 may be exposed. Accordingly, it is possible to stably connect the second semiconductor layer 13 and a second contact electrode CNE2 (see FIG. 26) to be described below.

Figure 8:
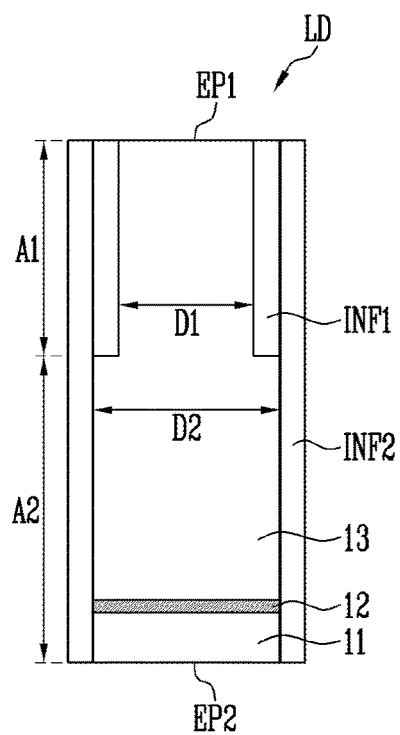
FIG. 8 is a cross-sectional view illustrating a light-emitting element according to another embodiment.

FIG. 8 is a cross-sectional view illustrating a light-emitting element according to another embodiment.

Referring to FIG. 8, a light-emitting element LD according to the present embodiment is distinguished from the embodiment of FIGS. 1 and 2 in that a second semiconductor layer 13 is disposed at a first end portion EP1 and a first semiconductor layer 11 is disposed at a second end portion EP2.

Specifically, the second semiconductor layer 13 may be disposed in a first area A1. The first semiconductor layer 11 and/or an active layer 12 may be disposed in a second area A2. That is, the first semiconductor layer 11 may have a second diameter D2, the active layer 12 may have the second diameter D2, and the second semiconductor layer 13 may have a first diameter D1. In addition, an area of the second semiconductor layer 13 at the first end portion EP1 may be smaller than an area of the first semiconductor layer 11 at the second end portion EP2. According to embodiments, a portion of the second semiconductor layer 13 may be further disposed in the second area A2. In this case, the second semiconductor layer 13 of the first area A1 may have the first diameter D1, and the second semiconductor layer 13 of the second area A2 may have the second diameter D2. However, the present invention is not limited thereto, and the relative positions of the first semiconductor layer 11, the active layer 12, and/or the second semiconductor layer 13 may be variously changed.

Figure 9:
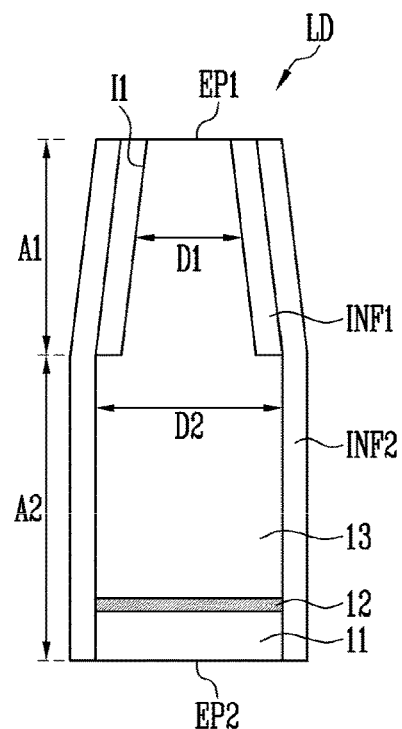
FIG. 9 is a cross-sectional view illustrating a light-emitting element according to another embodiment.

FIG. 9 is a cross-sectional view illustrating a light-emitting element according to another embodiment.

Referring to FIG. 9, a light-emitting element LD according to the present embodiment is distinguished from the embodiment of FIG. 8 in that a side surface of a first area A1 includes an inclined portion I1. For example, a side surface of a second semiconductor layer 13 in the first area A1 may include the inclined portion I1. Since the side surface of the first area A1 includes the inclined portion I1 having an inclination (e.g., a predetermined inclination), the first area A1 may have a shape of which a first diameter D1 is gradually decreased toward a first end portion EP1. As described above, when the side surface of the first area A1 includes the inclined portion I1, the first end portion EP1 and a second end portion EP2 may be easily distinguished through the inclined portion I1 of the first area A1 such that whether the light-emitting element LD is deflected and aligned may be determined using an optical inspection device.

Figure 10:
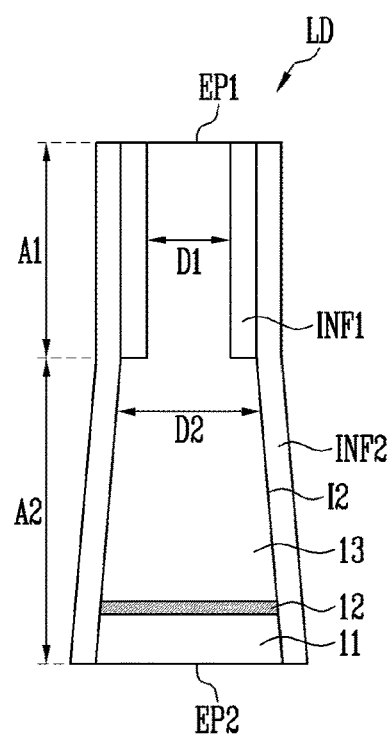
FIG. 10 is a cross-sectional view illustrating a light-emitting element according to another embodiment.

FIG. 10 is a cross-sectional view illustrating a light-emitting element according to another embodiment.

Referring to FIG. 10, a light-emitting element LD according to the present embodiment is distinguished from the embodiment of FIG. 8 in that a side surface of a second area A2 includes an inclined portion I2. For example, side surfaces of a first semiconductor layer 11 and/or an active layer 12 in the second area A2 may include the inclined portion I2. According to embodiments, a side surface of a second semiconductor layer 13 in the second area A2 may include the inclined portion I2. Since the side surface of the second area A2 includes the inclined portion I2 having an inclination (e.g., a predetermined inclination), the second area A2 may have a shape of which a second diameter D2 is gradually increased toward a second end portion EP2. As described above, when the side surface of the second area A2 includes the inclined portion I2, a first end portion EP1 and the second end portion EP2 may be easily distinguished through the inclined portion I2 of the second area A2 such that whether the light-emitting element LD is deflected and aligned may be determined using an optical inspection device.

Figure 11:
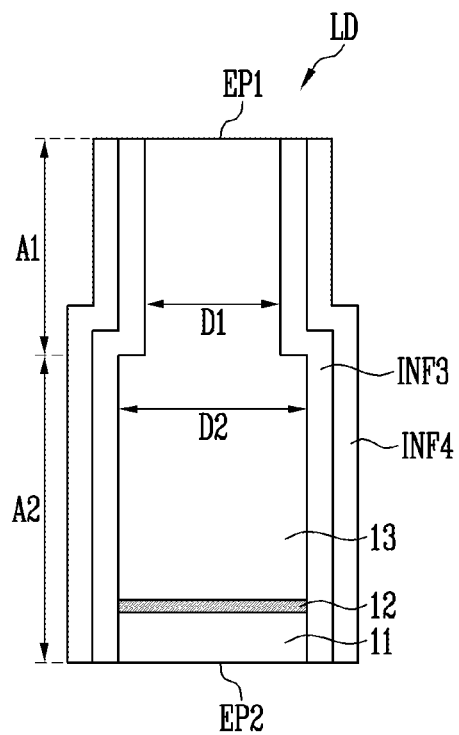
FIG. 11 is a cross-sectional view illustrating a light-emitting element according to another embodiment.

FIG. 11 is a cross-sectional view illustrating a light-emitting element according to another embodiment.

Referring to FIG. 11, a light-emitting element LD according to the present embodiment is distinguished from the embodiment of FIG. 8 in that the light-emitting element LD includes a third insulating film INF3 and a fourth insulating film INF4 which surround a first area A1 and a second area A2. The third insulating film INF3 may be formed to surround the first area A1 and the second area A2. In an embodiment, the third insulating film INF3 may be disposed directly on surfaces of a first semiconductor layer 11, an active layer 12, and/or a second semiconductor layer 13 in the first area A1 and the second area A2. The third insulating film INF3 may expose first and second end portions EP1 and EP2 of the light-emitting element LD having different polarities. In an embodiment, the third insulating film INF3 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). The fourth insulating film INF4 may be disposed on the third insulating film INF3. The fourth insulating film INF4 may be disposed to surround the third insulating film INF3. In an embodiment, the fourth insulating film INF4 may be disposed directly on a surface of the third insulating film INF3. The fourth insulating film INF4 may expose the first and second end portions EP1 and EP2 of the light-emitting element LD having different polarities. In an embodiment, the fourth insulating film INF4 may include the same material as the third insulating film INF3. For example, the fourth insulating film INF4 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). However, the present invention is not limited thereto, and the fourth insulating film INF4 may include a material different from that of the third insulating film INF3.

The third insulating film INF3 and the fourth insulating film INF4 may each have different inner diameters in the areas A1 and A2 due to a difference in diameter between the first area A1 and the second area A2. For example, an inner diameter of the third insulating film INF3 in the first area A1 may be smaller than an inner diameter of the third insulating film INF3 in the second area A2. Similarly, an inner diameter of the fourth insulating film INF4 in the first area A1 may be smaller than an inner diameter of the fourth insulating film INF4 in the second area A2.

Figure 12:
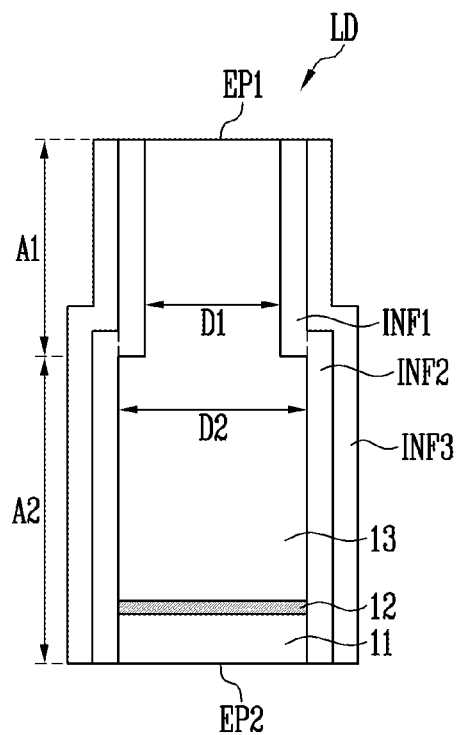
FIG. 12 is a cross-sectional view illustrating a light-emitting element according to another embodiment.

FIG. 12 is a cross-sectional view illustrating a light-emitting element according to another embodiment.

Referring to FIG. 12, a light-emitting element LD according to the present embodiment is distinguished from the embodiment of FIG. 8 in that the light-emitting element LD includes a first insulating film INF1 and a second insulating film INF2 which respectively surround a first area A1 and a second area A2.

In an embodiment, the first insulating film INF1 may be disposed directly on a surface of a second semiconductor layer 13 in the first area A1. In an embodiment, the first insulating film INF1 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$).

In an embodiment, the second insulating film INF2 may be disposed directly on surfaces of a second semiconductor layer 11, an active layer 12, and/or the second semiconductor layer 13 in the second area A2. In an embodiment, the second insulating film INF2 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). According to embodiments, the second insulating film INF2 may include the same material as the first insulating film INF1. In this case, the first insulating film INF1 and the second insulating film INF2 may be concurrently (e.g., simultaneously) formed in a same process, but the present invention is not limited thereto.

A third insulating film INF3 may be disposed on the first insulating film INF1 and the second insulating film INF2. The third insulating film INF3 may be disposed to surround the first insulating film INF1 and the second insulating film INF2. In an embodiment, the third insulating film INF3 may be disposed directly on surfaces of the first insulating film INF1 and the second insulating film INF2. The third insulating film INF3 may expose first and second end portions EP1 and EP2 of the light-emitting element LD having different polarities. In an embodiment, the third insulating film INF3 may include at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$).

A method of manufacturing the light-emitting elements according to the above-described embodiments will be described below.

FIGS. 13 to 20 are cross-sectional views of processes of a method of manufacturing a light-emitting element according to an embodiment. Herein, components that are substantially the same as those of FIGS. 1 to 11 are denoted by the same reference numerals, and further detailed description thereof may be omitted.

Figure 13:
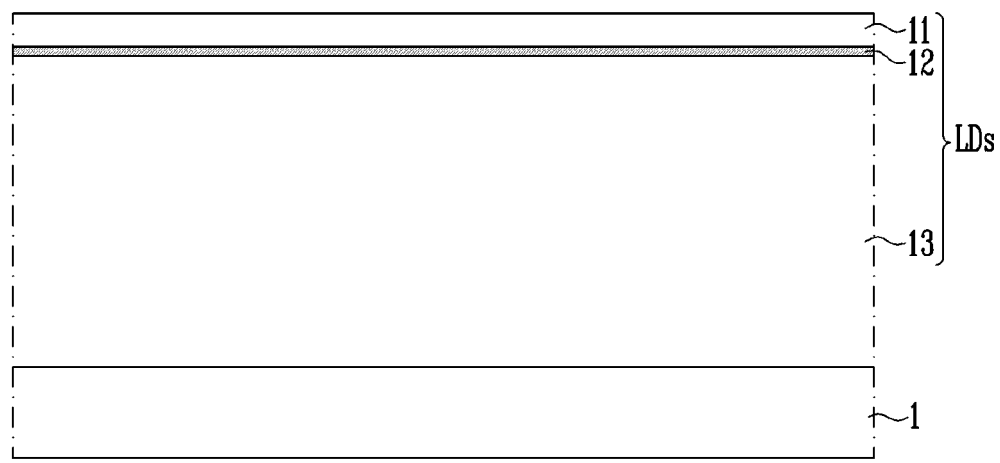
FIGS. 13 to 20 are cross-sectional views illustrating processes of a method of manufacturing a light-emitting element according to an embodiment.

Referring to FIG. 13, a light-emitting stack LDs is formed on a stack substrate 1.

In an embodiment, the stack substrate 1 may include any of a sapphire substrate and a transparent substrate, such as a glass substrate. However, the present invention is not limited thereto, and the stack substrate 1 may be formed as a conductive substrate, such as a GaN, SiC, ZnO, Si, GaP, or GaAs substrate. Herein, a case in which the stack substrate 1 is a sapphire substrate will be described.

In an embodiment, the light-emitting stack LDs may be formed by growing a seed crystal through an epitaxial method. According to embodiments, the light-emitting stack LDs may be formed through an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition method (MOCVD), or the like, and, in an embodiment, through the MOCVD method, but the present invention is not limited thereto.

A precursor material for forming the light-emitting stack (LDs) is not particularly limited within a range that may be typically selected to form a target material. As an example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)3$), or triethyl phosphate ($(C_2H_5)_3PO_4$) but is not limited thereto. The light-emitting stack LDs may include a first semiconductor layer 11, an active layer 12, and a second semiconductor layer 13. FIG. 13 illustrates a case in which the second semiconductor layer 13 is first formed on the stack substrate 1, and then the active layer 12 and the first semiconductor layer 11 are sequentially formed, but the present invention is not limited thereto. According to embodiments, the first semiconductor layer 11 may be first formed on the stack substrate 1, and then the active layer 12 and the second semiconductor layer 13 may be sequentially formed, thereby manufacturing light-emitting elements LD as shown in FIGS. 8 to 12.

In an embodiment, although not shown separately, a buffer layer and/or a sacrificial layer may be further disposed between the stack substrate 1 and the second semiconductor layer 13. The buffer layer may reduce a difference in lattice constant between the stack substrate 1 and the second semiconductor layer 13. As an example, the buffer layer may include an undoped semiconductor, may include substantially the same material as the second semiconductor layer 13, and may include a material not n-type or p-type doped. In an embodiment, the buffer layer may include at least one selected from undoped InAlGaN, GaN, AlGaN, InGaN, AlN, and InN, but the present invention is not limited thereto. The sacrificial layer may include a material allowing a crystal of a semiconductor layer to smoothly grow in a subsequent process. The sacrificial layer may include at least one selected from an insulating material and a conductive material. As an example, the insulating material of the sacrificial layer may include any of silicon oxide ($SiO_x$), silicon nitride ($SiN_x$), silicon oxynitride ($SiO_xN_y$), and the like, and the conductive material thereof may include any of ITO, IZO, IGO, ZnO, graphene, graphene oxide, and the like, but the present invention is not limited thereto.

Figure 14:
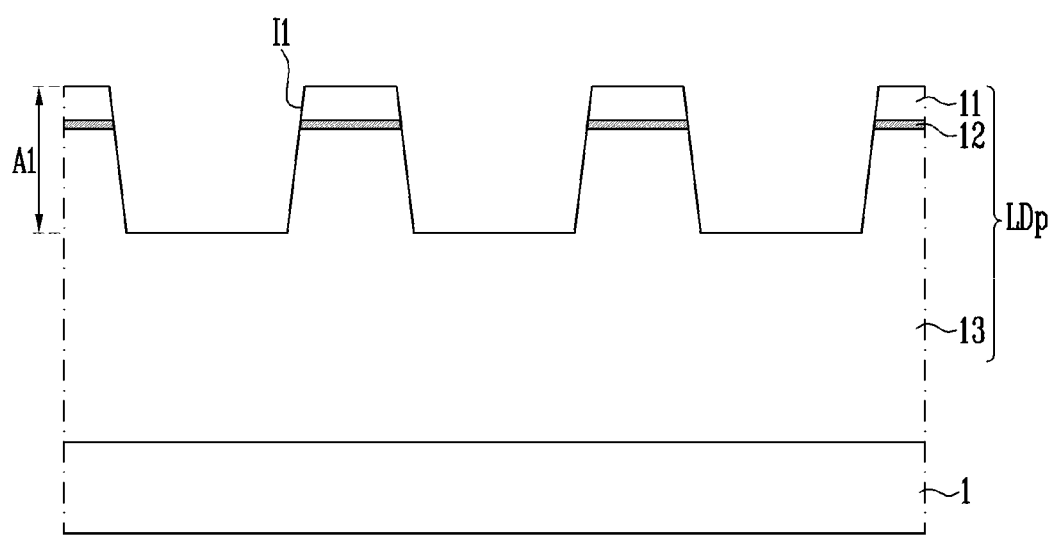

Referring to FIG. 14, next, the light-emitting stack LDs is primary etched to form first areas A1 of light-emitting patterns LDp. The first semiconductor layer 11 and the active layer 12 of the light-emitting patterns LDp may be etched through the primary etching. According to embodiments, the second semiconductor layer 13 of the light-emitting patterns LDp may be partially etched though the primary etching. A process of primary etching the light-emitting stack LDs may be performed through a typical method. For example, an etching process may be performed through a dry etching method, a wet etching method, a reactive ion etching (RIE) method, or an inductively coupled plasma reactive ion etching (ICP-RIE) method, or the like. In an embodiment, when the first area A1 of the light-emitting patterns LDp is formed through dry etching, an inclined portion I1 may be formed on a side surface of the first area A1. That is, the inclined portion I1 may be formed on side surfaces of the first semiconductor layer 11 and/or the active layer 12 in the first area A1. According to embodiments, when the second semiconductor layer 13 is partially etched through the primary etching, the inclined portion I1 may also be formed on a side surface of the second semiconductor layer 13 in the first area A1. Since the inclined portion I1 has been described with reference to FIGS. 3 and 9, redundant description thereof is omitted.

Figure 15:
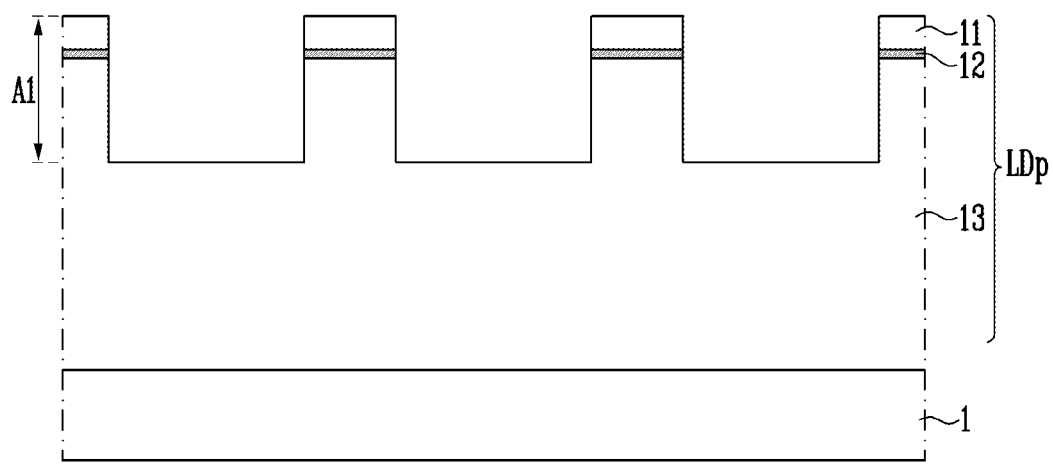

Referring to FIG. 15, in an embodiment, the first area A1 of the light-emitting patterns LDp is surface-treated to remove the inclined portion I1 of the first area A1. The surface treatment may be performed using an alkaline aqueous solution. For example, the surface treatment may be performed using at least one selected from potassium hydroxide (KOH), sodium hydroxide (NaOH), tetramethyl ammonium hydroxide (TMAH), and hydrazine ($N_2H_4$), but the present invention is not limited thereto. According to embodiments, the surface treatment may be omitted. In the light-emitting element LD manufactured by omitting the surface treatment, as shown in FIGS. 3 and 9, the side surface of the first area A1 may include the inclined portion I1.

Figure 16:
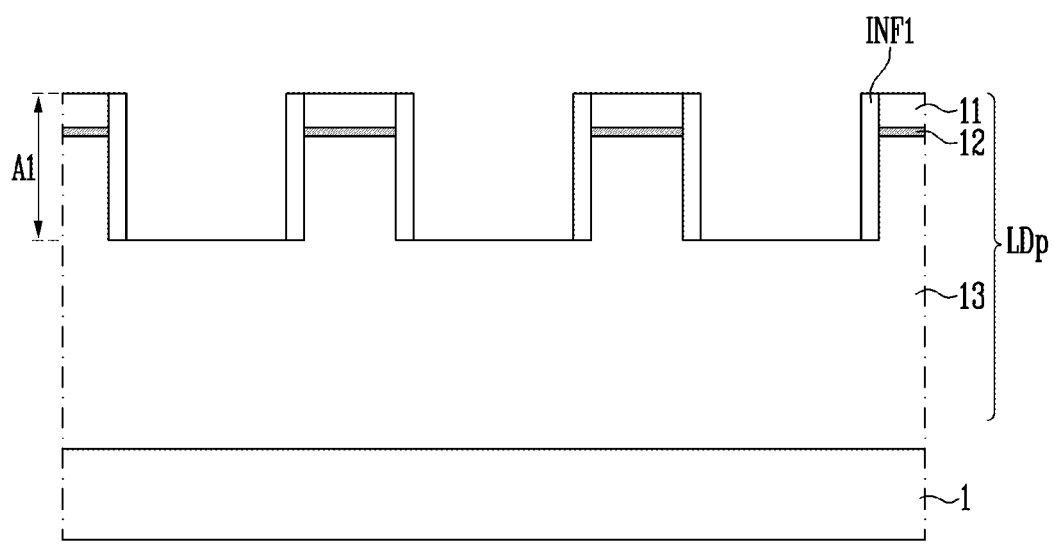

Referring to FIG. 16, then, a first insulating film INF1 is formed on the first area A1 of the light-emitting patterns LDp. In an embodiment, the first insulating film INF1 may be partially formed only on the first area A1 exposed through the first etching. For example, the first insulating film INF1 may be formed to surround the first area A1. In an embodiment, the first insulating film INF1 may be disposed directly on surfaces of the first semiconductor layer 11, the active layer 12, and/or the second semiconductor layer 13 in the first area A1. In an embodiment, the first insulating film INF1 may be made of at least one selected from aluminum oxide ($AlO_x$), aluminum nitride ($AlN_x$), silicon oxide ($SiO_x$), silicon nitride ($SiN_x$), silicon oxynitride ($SiO_xN_y$), zirconium oxide ($ZrO_x$), hafnium oxide ($HfO_x$), and titanium oxide ($TiO_x$). The first insulating film INF1 may be formed on the first area A1 to prevent or substantially prevent damage to the first area A1, particularly, the active layer 12 of the first area A1 in a subsequent process.

Figure 17:
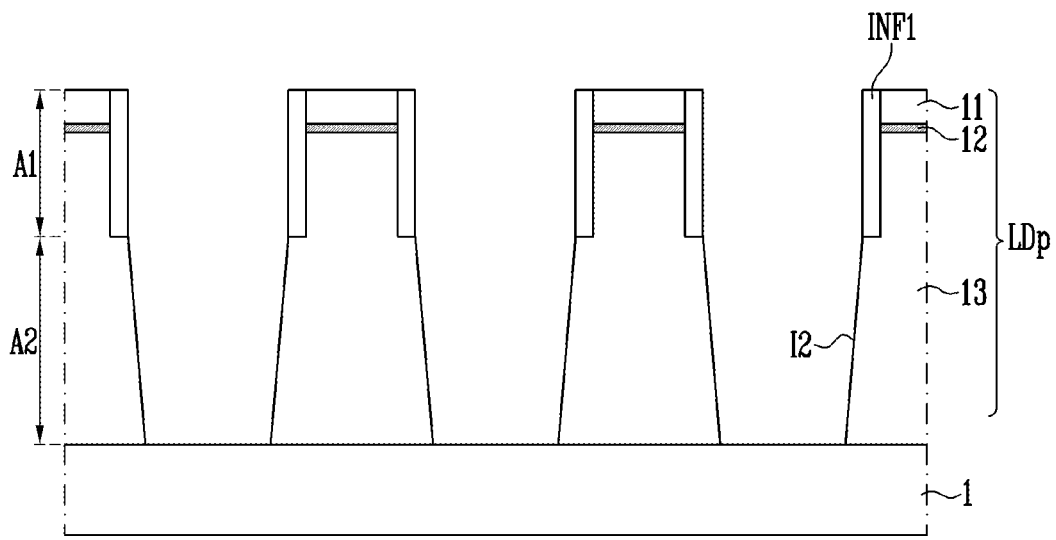

Referring to FIG. 17, next, the light-emitting patterns LDp are secondary etched to form second areas A2 of the light-emitting patterns LDp. The second semiconductor layer 13 of the light-emitting patterns LDp may be etched through the second etching. In a process of secondary etching the second semiconductor layer 13, the first area A1 can be protected by the first insulating film INF1 such that surface defects of the light-emitting element LD can be minimized or reduced to improve the lifetime and efficiency thereof as described above.

In an embodiment, a diameter of the second area A2 may be greater than a diameter of the first area A1. A process of secondary etching the light-emitting patterns LDp may be performed through a typical method. For example, an etching process may be performed through a dry etching method, a wet etching method, a RIE method, an ICP-RIE method, or the like. In an embodiment, when the second area A2 of the light-emitting patterns LDp is formed through dry etching, an inclined portion I2 may be formed on a side surface of the second area A2. That is, the inclined portion I2 may be formed on a side surface of the second semiconductor layer 13 in the second area A2. In addition, since the inclined portion I2 has been described with reference to FIGS. 4 and 10, redundant description thereof will be omitted.

Figure 18:
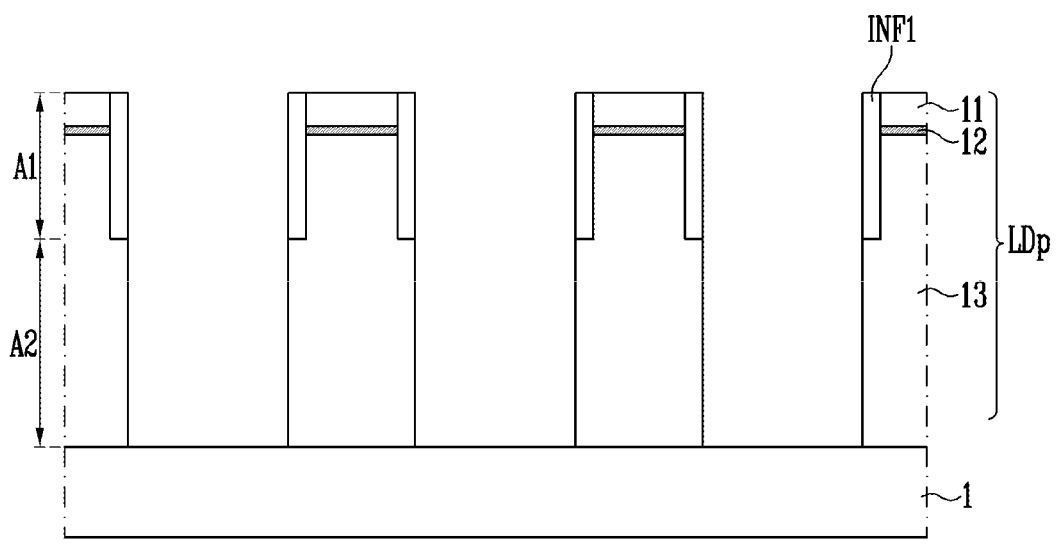

Referring to FIG. 18, in an embodiment, the second area A2 of the light-emitting patterns LDp is then surface-treated to remove the inclined portion I2 of the second area A2. The surface treatment may be performed using an alkaline aqueous solution. For example, the surface treatment may be performed using at least one selected from potassium hydroxide (KOH), sodium hydroxide (NaOH), TMAH, and hydrazine ($N_2H_4$), but the present invention is not limited thereto. According to embodiments, the surface treatment may be omitted. In the light-emitting element LD manufactured by omitting the surface treatment, as shown in FIGS. 4 and 10, the side surface of the second area A2 may include the inclined portion I2.

Figure 19:
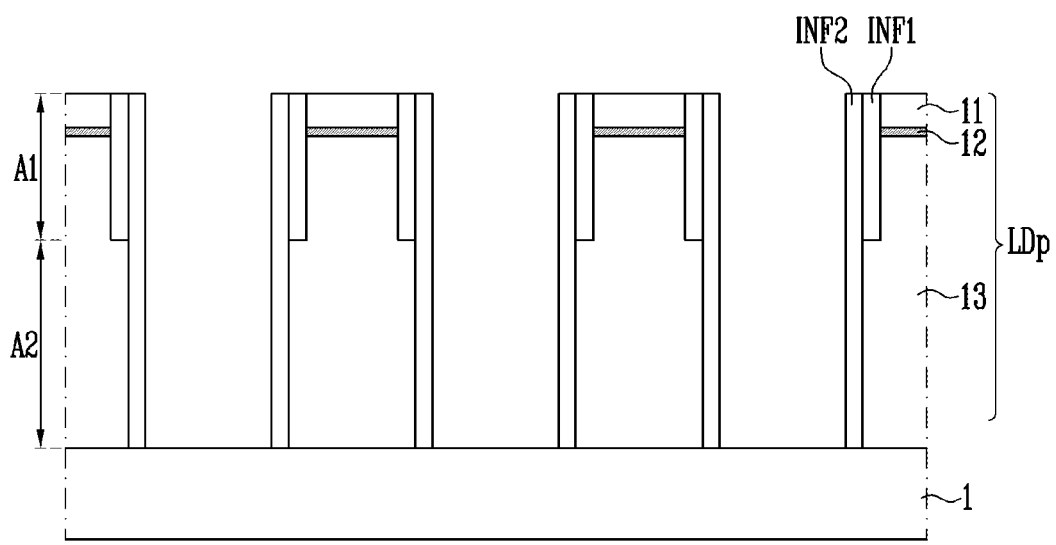

Referring to FIG. 19, next, a second insulating film INF2 is formed on the first area A1 and the second area A2 of the light-emitting patterns LDp. The second insulating film INF2 may be disposed to surround the first insulating film INF1. In an embodiment, the second insulating film INF2 may be formed directly on a surface of the first insulating film INF1. In addition, the second insulating film INF2 may be formed to surround the second area A2 exposed by the first insulating film INF1. In an embodiment, the second insulating film INF2 may be formed directly on a surface of the second semiconductor layer 13 in the second area A2 exposed by the first insulating film INF1. In an embodiment, the second insulating film INF2 may be made of the same material as the first insulating film INF1. For example, the second insulating film INF2 may be made of at least one selected from aluminum oxide (AlO$_x$), aluminum nitride (AlN$_x$), silicon oxide (SiO$_x$), silicon nitride (SiN$_x$), silicon oxynitride (SiO$_x$N$_y$), zirconium oxide (ZrO$_x$), hafnium oxide (HfO$_x$), and titanium oxide (TiO$_x$). However, the present invention is not limited thereto, and the second insulating film INF2 may be made of a material different from that of the first insulating film INF1. According to embodiments, an operation of forming the second insulating film INF2 may be omitted. In the light-emitting element LD manufactured by omitting the operation of forming the second insulating film INF2, as shown in FIG. 7, the side surface of the second semiconductor layer 13 in the second area A2 may be exposed.

Figure 20:
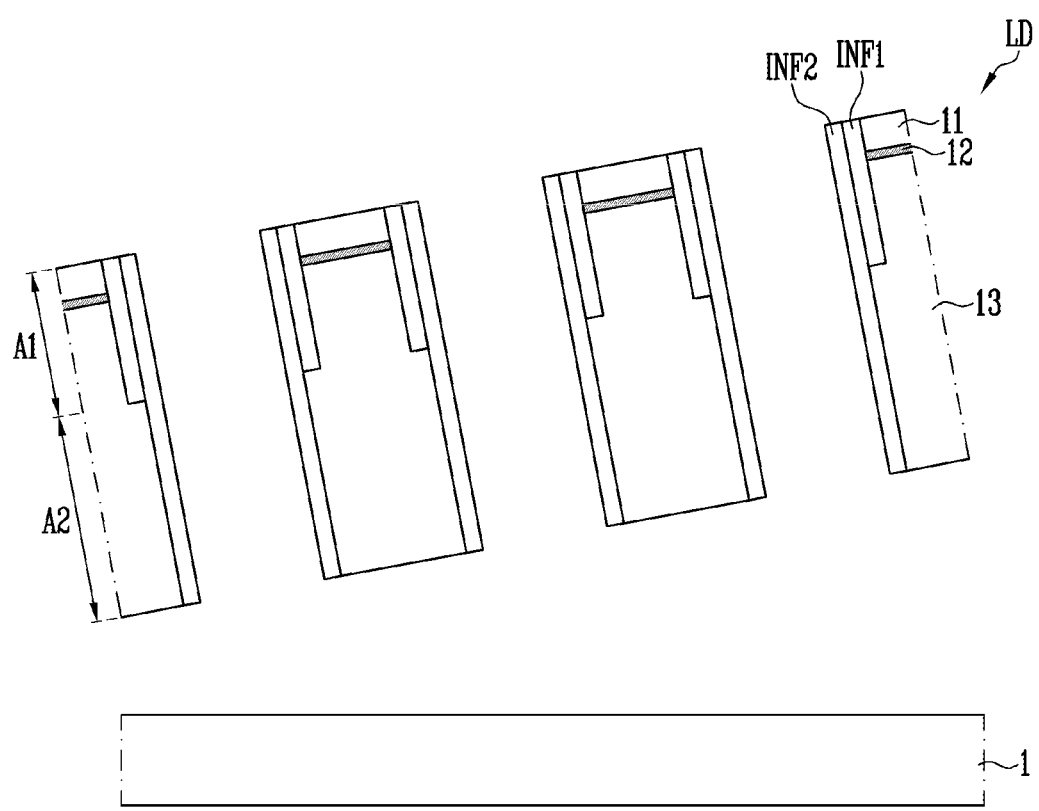

Referring to FIG. 20, then, the plurality of light-emitting patterns LDp may be separated from the stack substrate 1, thereby manufacturing the light-emitting elements LD shown in FIGS. 1 and 2. According to the method of manufacturing the light-emitting element LD according to the above-described embodiment, since the first insulating film INF1 is formed on the first area A1 primary etched, it is possible to prevent or substantially prevent damage to the first area A1 in a process of etching the second area A2 such that the surface defects of the light-emitting element LD can be minimized or reduced to improve the lifetime and efficiency thereof as described above.

Subsequently, other embodiments will be described. In the following embodiments, the same components as the above-described components will be denoted by the same reference numerals, and repetitive descriptions thereof may be omitted or simplified.

FIGS. 21 to 25 are cross-sectional views of processes of a method of manufacturing a light-emitting element according to another embodiment. FIGS. 21 to 25 are cross-sectional views for describing a method of manufacturing the light-emitting elements LD of FIGS. 5 and 11, and components that are substantially the same as those of FIGS. 5 to 11 are denoted by the same reference numerals, and detailed description thereof may be omitted.

Figure 21:
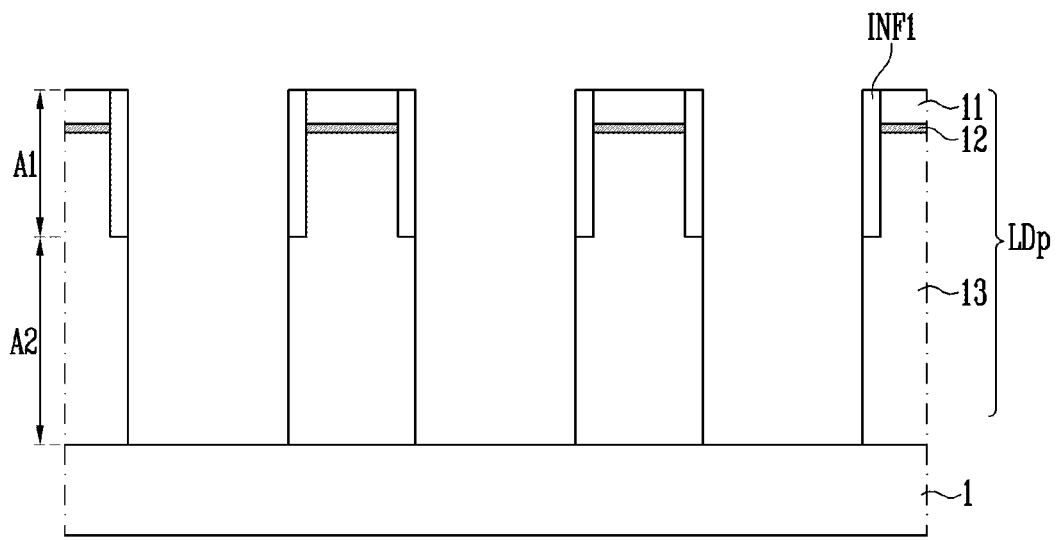
FIGS. 21 to 25 are cross-sectional views illustrating processes of a method of manufacturing a light-emitting element according to another embodiment.

Referring to FIG. 21, a first insulating film INF1 is formed on a first area A1 that is primary etched, and a second area A2 of light-emitting patterns LDp is formed through secondary etching. Since a manufacturing process thereof has been described with reference to FIGS. 13 to 18, redundant description thereof will be omitted.

Figure 22:
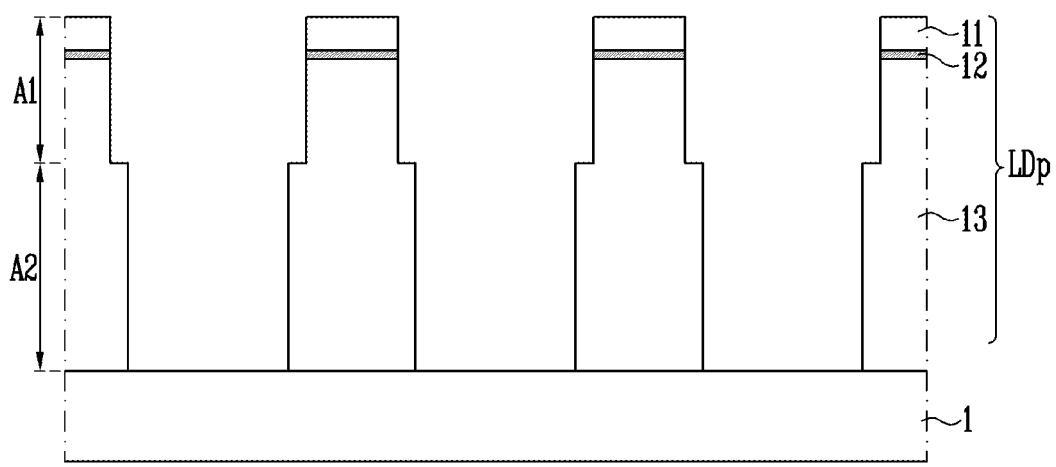

Referring to FIG. 22, then, the first insulating film INF1 of the first area A1 of the light-emitting patterns LDp is removed. As the first insulating film INF1 is removed, a side surface of the first area A1 may be exposed. For example, side surfaces of a first semiconductor layer 11 and an active layer 12 in the first area A1 may be exposed. According to embodiments, when a second semiconductor layer 13 is further disposed in the first area A1, as the first insulating film INF1 is removed, the second semiconductor layer 13 in the first area A1 may also be exposed.

Figure 23:
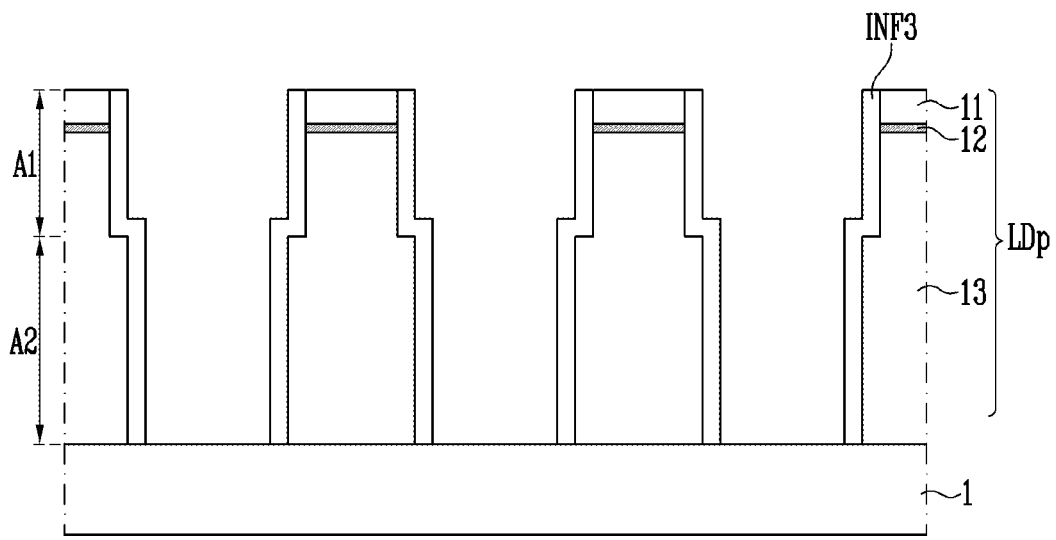

Referring to FIG. 23, next, a third insulating film INF3 is formed on the first area A1 and the second area A2 of the light-emitting patterns LDp. The third insulating film INF3 may be formed to surround the first area A1 and the second area A2. In an embodiment, the third insulating film INF3 may be formed directly on surfaces of the first area A1 and the second area A2. For example, the third insulating film INF3 may be formed directly on surfaces of the first semiconductor layer 11, the active layer 12, and the second semiconductor layer 13 in the first area A1 and the second area A2. In an embodiment, the third insulating film INF3 may be made of at least one selected from aluminum oxide (AlO$_x$), aluminum nitride (AlN$_x$), silicon oxide (SiO$_x$), silicon nitride (SiN$_x$), silicon oxynitride (SiO$_x$N$_y$), zirconium oxide (ZrO$_x$), hafnium oxide (HfO$_x$), and titanium oxide (TiO$_x$), but the present invention is not limited thereto.

Figure 24:
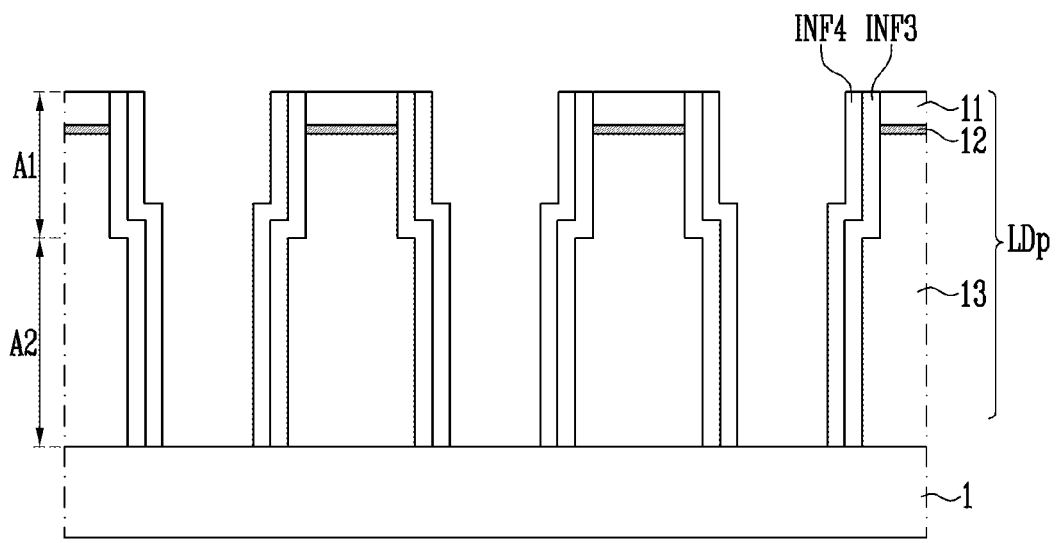

Referring to FIG. 24, a fourth insulating film INF4 is formed on the third insulating film INF3. The fourth insulating film INF4 may be formed to surround the third insulating film INF3. In an embodiment, the fourth insulating film INF4 may be formed directly on a surface of the third insulating film INF3. In an embodiment, the fourth insulating film INF4 may be made of the same material as the third insulating film INF3. For example, the fourth insulating film INF4 may be made of at least one selected from aluminum oxide (AlO$_x$), aluminum nitride (AlN$_x$), silicon oxide (SiO$_x$), silicon nitride (SiN$_x$), silicon oxynitride (SiO$_x$N$_y$), zirconium oxide (ZrO$_x$), hafnium oxide (HfO$_x$), and titanium oxide (TiO$_x$). However, the present invention is not limited thereto, and the fourth insulating film INF4 may be made of a material different from that of the third insulating film INF3.

Figure 25:
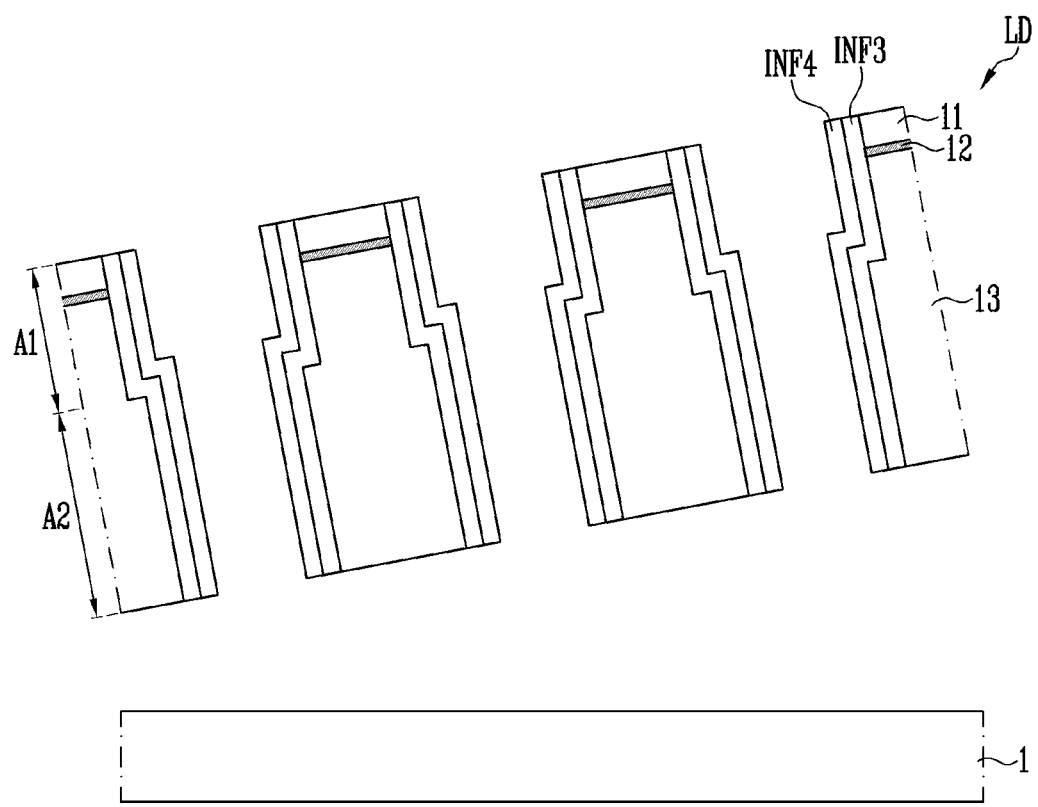

Referring to FIG. 25, then, the plurality of light-emitting patterns LDp may be separated from a stack substrate 1, thereby manufacturing the light-emitting elements LD shown in FIGS. 5 and 11. According to the method of manufacturing the light-emitting element LD according to the above-described embodiment, since the first insulating film INF1 is formed on the first area A1 that is primary etched, it is possible to prevent or substantially prevent damage to the first area A1 in a process of etching the second area A2, thereby improving the lifetime and efficiency of the light-emitting element LD as described above.

A display device including the light-emitting elements according to the above-described embodiments will be described below.

Figure 26:
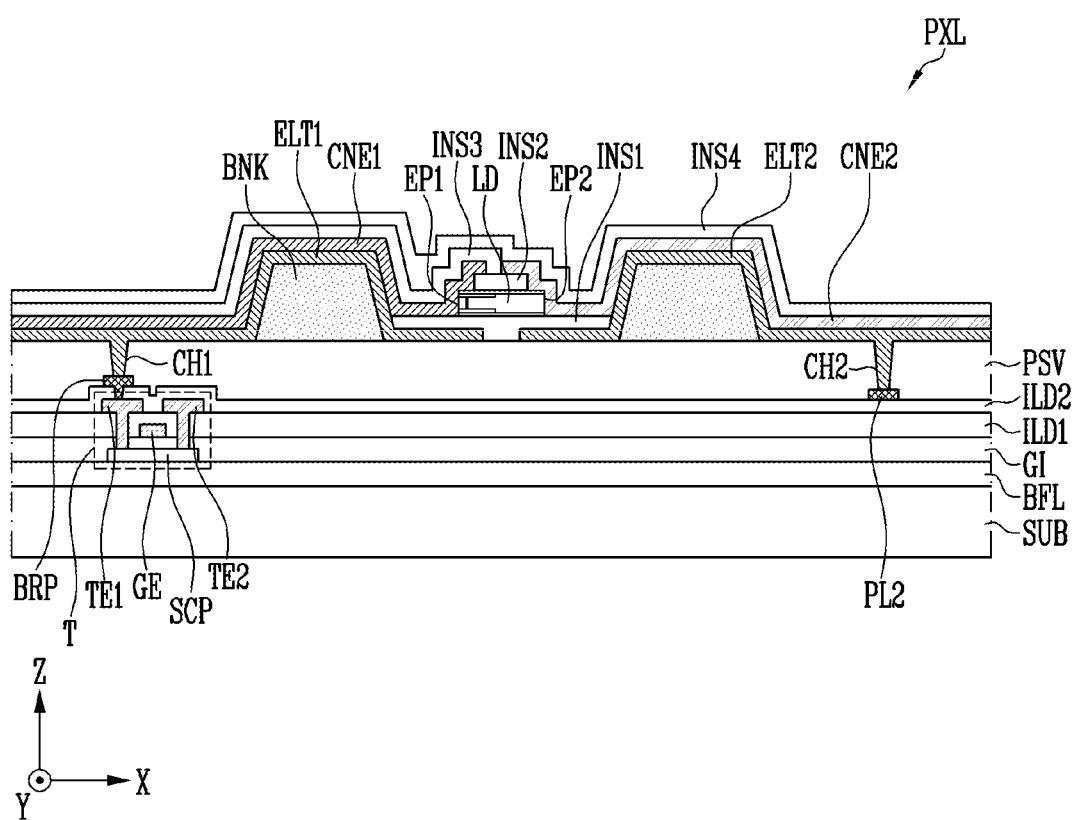
FIG. 26 is a cross-sectional view illustrating a display device according to an embodiment.

FIG. 26 is a cross-sectional view illustrating a display device according to an embodiment. FIG. 26 is a cross-sectional view for describing a display device including the light-emitting elements LD described with reference to FIGS. 1 to 25, and, particularly, pixels PXL provided in the display device are mainly shown. FIG. 26 illustrates a structure of each pixel PXL based on one light-emitting element LD and illustrates transistors T connected to a first electrode ELT1 among various circuit elements. Meanwhile, the structure of the transistor T and/or the position thereof for each layer are not limited to the embodiment illustrated in FIG. 26 and may be variously changed according to embodiments.

Referring to FIG. 26, the pixel PXL and the display device including the same may include a substrate SUB, the transistors T, first and second electrodes ELT1 and ELT2, the light-emitting elements LD, and first and second contact electrodes CNE1 and CNE2.

The substrate SUB may constitute a base member and may be a rigid or flexible substrate or film. As an example, the substrate SUB may be a rigid substrate made of glass or tempered glass, a flexible substrate (or thin film) made of plastic or metal, or at least one insulating layer. The material and/or physical properties of the substrate SUB are not particularly limited. In an embodiment, the substrate SUB may be substantially transparent. Here, the term "substantially transparent" may mean that light can be transmitted at a certain transmittance (e.g., a predetermined transmittance) or more. In another embodiment, the substrate SUB may be semi-transparent or opaque. In addition, the substrate SUB may include a reflective material according to embodiments.

A buffer layer BFL may be disposed on the substrate SUB. The buffer layer BFL may prevent or substantially prevent impurities from diffusing into each circuit element. The buffer layer BFL may be provided as a single-layer but may also be provided as a multi-layer including at least two layers. When the buffer layer BFL is formed as the multi-layer, respective layers may be made of the same material or may be made of different materials. Various circuit elements such as the transistors T and various lines connected to the circuit elements may be disposed on the buffer layer BFL. The buffer layer BFL may be omitted according to embodiments.

Each of the transistors T may include a semiconductor pattern SCP, a gate electrode GE, and first and second transistor electrodes TE1 and TE2. FIG. 26 illustrates an embodiment in which the transistor T includes the first and second transistor electrodes TE1 and TE2 formed separately from the semiconductor pattern SCP, but the present invention is not limited thereto. For example, in another embodiment, the first and/or second transistor electrodes TE1 and TE2 provided in at least one transistor T may be integrated with each semiconductor pattern SCP.

The semiconductor pattern SCP may be disposed on the buffer layer BFL. As an example, the semiconductor pattern SCP may be disposed between a gate insulating layer GI and the substrate SUB on which the buffer layer BFL is formed. The semiconductor pattern SCP may include a first region in contact with each first transistor electrode TE1, a second region in contact with each second transistor electrode TE2, and a channel region positioned between the first region and the second region. According to embodiments, one of the first and second regions may be a source region, and the other thereof may be a drain region.

According to embodiments, the semiconductor pattern SCP may be a semiconductor pattern made of polysilicon, amorphous silicon, an oxide semiconductor, or the like. In addition, the channel region of the semiconductor pattern SCP may be a semiconductor pattern not doped with impurities, i.e., an intrinsic semiconductor, and the first and second regions of the semiconductor pattern SCP may each be a semiconductor pattern doped with impurities (e.g., predetermined impurities).

The gate insulating layer GI may be disposed on the semiconductor pattern SCP. As an example, the gate insulating layer GI may be disposed between the semiconductor pattern SCP and the gate electrode GE. The gate insulating layer GI may be provided as a single-layer or a multi-layer and may include any of various types of organic/inorganic insulating materials, such as silicon nitride ($SiN_x$), silicon oxide ($SiO_x$), or silicon oxynitride ($SiO_xN_y$).

The gate electrode GE may be disposed on the gate insulating layer GI. For example, the gate electrode GE may be disposed to overlap the semiconductor pattern SCP with the gate insulating layer GI interposed therebetween.

A first interlayer insulating layer ILD1 may be disposed on the gate electrode GE. As an example, the first interlayer insulating layer ILD1 may be disposed between the gate electrode GE and the first and second transistor electrodes TE1 and TE2. The first interlayer insulating layer ILD1 be provided as a single-layer or a multi-layer and may include at least one inorganic insulating material and/or organic insulating material. For example, the first interlayer insulating layer ILD1 may include any of various types of organic/inorganic insulating materials, such as silicon nitride ($SiN_x$), silicon oxide ($SiO_x$), or silicon oxynitride ($SiO_xN_y$), and the structural material of the first interlayer insulating layer ILD1 is not particularly limited.

The first and second transistor electrodes TE1 and TE2 may be disposed on each semiconductor pattern SCP with at least one first interlayer insulating layer ILD1 interposed therebetween. For example, the first and second transistor electrodes TE1 and TE2 may be formed on different end portions of the semiconductor pattern SCP with the gate insulating layer GI and the first interlayer insulating layer ILD1 interposed therebetween. The first and second transistor electrodes TE1 and TE2 may be electrically connected to each semiconductor pattern SCP. For example, the first and second transistor electrodes TE1 and TE2 may be connected to the first and second regions of the semiconductor pattern SCP through respective contact holes passing through the gate insulating layer GI and the first interlayer insulating layer ILD1. According to embodiments, one of the first and second transistor electrodes TE1 and TE2 may be a source electrode, and the other thereof may be a drain electrode.

The transistor T may be connected to at least one pixel electrode. As an example, the transistor T may be electrically connected to the first electrode ELT1 of a corresponding pixel PXL through a contact hole (for example, a first contact hole CH1) passing through a protective layer PSV and/or a bridge pattern BRP.

A power line PL2 may be formed on a layer that is the same as or different from the gate electrode GE of the transistors T or the first and second transistor electrodes TE1 and TE2. As an example, the power line PL2 may be disposed on a second interlayer insulating layer ILD2 and thus may be at least partially covered by the protective layer PSV. The power line PL2 may be electrically connected to the second electrode ELT2 disposed on the protective layer PSV through a second contact hole CH2 passing through the protective layer PSV. However, the position and/or structure of the power line PL2 may be variously changed.

The second interlayer insulating layer ILD2 may be disposed on the first interlayer insulating layer ILD1 and may cover the first and second transistor electrodes TE1 and TE2 positioned on the first interlayer insulating layer ILD1. The second interlayer insulating layer ILD2 be provided as a single-layer or a multi-layer and may include at least one inorganic insulating material and/or organic insulating material. For example, the second interlayer insulating layer ILD2 may include any of various types of organic/inorganic insulating materials, such as silicon nitride ($SiN_x$), silicon oxide ($SiO_x$), or silicon oxynitride ($SiO_xN_y$), but the present invention is not limited thereto.

The bridge pattern BRP and the power line PL2 for electrically connecting the transistor T and the first electrode ELT1 may be formed on the second interlayer insulating layer ILD2. However, the second interlayer insulating layer ILD2 may be omitted according to embodiments.

The protective layer PSV may be disposed on circuit elements including the transistors T and/or lines including the power line PL2. The protective layer PSV may be provided as a single-layer or a multi-layer and may include at least one inorganic insulating material and/or organic insulating material. As an example, the protective layer PSV may include an organic insulating layer at least and may serve to substantially planarize a stepped portion thereunder.

A bank BNK protruding in a third direction (Z-axis direction) may be disposed on the protective layer PSV. The bank BNK may be formed in a separate or integral pattern.

The bank BNK may have any of various shapes according to embodiments. In an embodiment, the bank BNK may be a bank structure having a forward taper structure. For example, as shown in FIG. 26, the bank BNK may be formed to have an inclined surface inclined at a certain angle with respect to the substrate SUB. However, the present invention is not limited thereto, and the bank BNK may have a sidewall with a curved shape or a stepped shape. As an example, the bank BNK may have a cross-section with a semicircle or semi-ellipse shape.

Electrodes and insulating layers disposed on the bank BNK may have a shape corresponding to the bank BNK. As an example, the bank BNK may serve as a reflective member that improves the luminous efficiency of the display device by guiding light emitted from the light-emitting elements LD in a front direction of the pixel PXL, that is, in the third direction (Z-axis direction) together with the first and second electrodes ELT1 and ELT2 formed thereon.

The bank BNK may include an insulating material including at least one inorganic material and/or organic material. As an example, the bank BNK may include at least one layer of an inorganic film including any of various inorganic insulating materials, such as silicon nitride (SiNx) or silicon oxide (SiOx). In an embodiment, the bank (BNK) may include at least one layer of an organic film and/or photo-resist film including any of various types of organic insulating materials or may be provided as a single-layered or multi-layered insulator including organic/inorganic materials in combination. That is, the structural material and/or pattern shape of the bank BNK may be variously changed.

The first and second electrodes ELT1 and ELT2 may be disposed on the bank BNK. The first and second electrodes ELT1 and ELT2 may be formed to be spaced apart from each other. The first and second electrodes ELT1 and ELT2 may respectively receive a first alignment signal (or first alignment voltage) and a second alignment signal (or second alignment voltage) in an alignment operation of the light-emitting elements LD. As an example, one of the first and second electrodes ELT1 and ELT2 may receive an alternating current (AC) alignment signal, and the other of the first and second electrodes ELT1 and ELT2 may receive an alignment voltage (for example, a ground voltage) having a constant voltage level. Accordingly, an electric field may be formed between the first electrode ELT1 and the second electrode ELT2 such that the light-emitting elements LD supplied to each of the pixels PXL may be aligned between the first electrode ELT1 and the second electrode ELT2.

The first electrode ELT1 may be electrically connected to the bridge pattern BRP through the first contact hole CH1 and may be electrically connected to the transistor T through the bridge pattern BRP. However, the present invention is not necessarily limited thereto, and the first electrode ELT1 may be connected directly to a power line (e.g., a predetermined power line) or signal line.

The second electrode ELT2 may be electrically connected to the power line PL2 through the second contact hole CH2. However, the present invention is not necessarily limited thereto, and the second electrode ELT2 may be connected directly to a power line (e.g., a predetermined power line) or signal line.

Each of the first and second electrodes ELT1 and ELT2 may include at least one conductive material. As an example, each of the first and second electrodes ELT1 and ELT2 may include at least one metal selected from various metal materials, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the at least one metal, or may include at least one conductive material selected from a conductive oxide, such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (ZTO), or fluorine tin oxide (FTO), and a conductive polymer such as poly(3,4-ethylenedioxythiophene) (PEDOT), but the present invention is not limited thereto. For example, each of the first and second electrodes ELT1 and ELT2 may include other conductive materials, such as carbon nanotubes or graphene. In addition, each of the first and second electrodes ELT1 and ELT2 may be provided as a single-layer or multi-layer. As an example, each of the first and second electrodes ELT1 and ELT2 may include a reflective electrode layer including a reflective conductive material. In addition, each of the first and second electrodes ELT1 and ELT2 may optionally further include at least one of at least one transparent electrode layer disposed on and/or below the reflective electrode layer and at least one conductive capping layer covering an upper portion of the reflective electrode layer and/or the transparent electrode layer.

A first insulating layer INS1 may be disposed on first areas of the first and second electrodes ELT1 and ELT2. The first insulating layer INS1 may be provided as a single-layer or a multi-layer and may include at least one inorganic insulating material and/or organic insulating material. For example, the first insulating layer INS1 may include any of various types of organic/inorganic materials, such as silicon nitride ($SiN_x$), silicon oxide ($SiO_x$), silicon oxynitride ($SiO_xN_y$), or aluminum oxide ($AlO_x$).

The light-emitting elements LD may be supplied and aligned between the first electrode ELT1 and the second electrode ELT2. The light-emitting elements LD may be manufactured through a method of manufacturing the light-emitting element described with reference to FIGS. 13 to 25. That is, since a first insulating film INF1 is formed on a first area A1 primary etched, it is possible to prevent or substantially prevent damage to the first area A1 in a process of etching a second area A2, thereby improving the lifetime and efficiency of the light-emitting element LD as described above.

The light-emitting elements LD may be provided in a form dispersed in a solution (e.g., predetermined solution) and may be supplied to an emission area of each of the pixels PXL through an inkjet printing method or the like. As an example, the light-emitting elements LD may be dispersed in a volatile solvent and supplied in each emission area. In this case, when a voltage (e.g., a predetermined voltage) is supplied through the first and second electrodes ELT1 and ELT2 of each of the pixels PXL, an electric field may be formed between the first electrode ELT1 and the second electrode ELT2 such that the light-emitting elements LD may be aligned between the first electrode ELT1 and the second electrode ELT2. After the light-emitting elements LD are aligned, the solvent may be volatilized or removed through another method to stably arrange the light-emitting elements LD between the first electrode ELT1 and the second electrode ELT2. In FIG. 26, one light-emitting element LD disposed in each pixel PXL is illustrated, but each pixel PXL may include a plurality of light-emitting elements LD provided between the first electrode ELT1 and the second electrode ELT2. Accordingly, descriptions will be given below assuming that the pixel PXL includes the plurality of light-emitting elements LD.

The second insulating layer INS2 may be disposed on second areas of the light-emitting elements LD. For example, the second insulating layer INS2 may be disposed on one area of each of the light-emitting elements LD so as to expose first and second end portions EP1 and EP2 of each of the light-emitting elements LD. As an example, the second insulating layer INS2 may be locally disposed on one area including a central area of each of the light-emitting elements LD. When the second insulating layer INS2 is formed on the light-emitting elements LD after the alignment of the light-emitting elements LD is completed, it is possible to prevent or substantially prevent the light-emitting elements LD from deviating from the aligned position thereof.

The second insulating layer INS2 may be provided as a single-layer or a multi-layer and may include at least one inorganic insulating material and/or organic insulating material. For example, the second insulating layer INS2 may include any of various types of organic/inorganic insulating materials, such as silicon nitride ($SiN_x$), silicon oxide ($SiO_x$), aluminum oxide ($AlO_x$), and a photoresist (PR) material.

The first and second contact electrodes CNE1 and CNE2 may be respectively disposed on both end portions of the light-emitting elements LD not covered by the second insulating layer INS2, that is, the first and second end portions EP1 and EP2. In an embodiment, as shown in FIG. 26, the first and second contact electrodes CNE1 and CNE2 may be sequentially formed on different layers on a surface of the substrate SUB. For example, a third insulating layer INS3 may be disposed between the contact electrodes CNE1 and CNE2 formed as different conductive layers. Meanwhile, the order of forming the first and second contact electrodes CNE1 and CNE2 may vary according to embodiments. For example, in another embodiment, before the first contact electrode CNE1 is formed, the second contact electrode CNE2 may be formed first, and after the third insulating layer INS3 is formed to cover the second contact electrode CNE2 and the second insulating layer INS2, the first contact electrode CNE1 may be formed on the third insulating layer INS3. However, the present invention is not limited thereto, and the first and second contact electrodes CNE1 and CNE2 may be formed as the same conductive layer.

In addition, the first and second contact electrodes CNE1 and CNE2 may be disposed on the first and second electrodes ELT1 and ELT2 so as to respectively cover exposed areas of the first and second electrodes ELT1 and ELT2. For example, the first and second contact electrodes CNE1 and CNE2 may be respectively disposed on at least first areas of the first and second electrodes ELT1 and ELT2 so as to be electrically connected to the first and second electrodes ELT1 and ELT2 on the bank BNK or around the bank BNK. Accordingly, the first and second contact electrodes CNE1 and CNE2 may be electrically connected to the first and second electrodes ELT1 and ELT2, respectively. That is, the first electrode ELT1 may be electrically connected to the first end portion EP1 of adjacent light-emitting element LD through the first contact electrode CNE1. In addition, the second electrode ELT2 may be electrically connected to the second end portion EP2 of adjacent light-emitting element LD through the second contact electrode CNE2.

The first and second contact electrodes CNE1 and CNE2 may be made of any of various transparent conductive materials. As an example, the first and second contact electrodes CNE1 and CNE2 may include at least one selected from various transparent conductive materials, such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (ZTO), and fluorine tin oxide (FTO) and may be substantially transparent or semi-transparent to satisfy desired transmittance. Accordingly, light emitted from the light-emitting elements LD through the first and second end portions EP1 and EP2 thereof may pass through the first and second contact electrodes CNE1 and CNE2 to be emitted to the outside of a display panel.

The third insulating layer INS3 may be disposed between the first contact electrode CNE1 and the second contact electrode CNE2. As described above, when the third insulating layer INS3 is formed between the first contact electrode CNE1 and the second contact electrode CNE2, the first and second contact electrodes CNE1 and CNE1 may be stably separated due to the third insulating layer INS3, thereby securing the electrical stability between the first end portion EP1 and the second end portion EP2 of the light-emitting elements LD. Accordingly, it is possible to effectively prevent or substantially prevent short circuit defects from occurring between the first end portion EP1 and the second end portion EP2 of the light-emitting elements LD. The third insulating layer INS3 may be provided as a single-layer or a multi-layer and may include at least one inorganic insulating material and/or organic insulating material. For example, the third insulating layer INS3 may include an of various types of organic/inorganic insulating materials, such as silicon nitride ($SiN_x$), silicon oxide ($SiO_x$), aluminum oxide ($AlO_x$), and a PR material. A fourth insulating layer INS4 may be disposed on the first and second contact electrodes CNE1 and CNE2 and/or the third insulating layer INS3. For example, the fourth insulating layer INS4 may cover the first and second electrodes ELT1 and ELT2, and the first, second, and/or third insulating layers INS1, INS2, and/or INS3, the light-emitting elements LD, and the first and second contact electrodes CNE1 and CNE2. The fourth insulating layer INS4 may include at least one layer of an inorganic film and/or organic film.

The fourth insulating layer INS4 may be provided as a single-layer or a multi-layer and may include at least one inorganic insulating material and/or organic insulating material. For example, the fourth insulating layer INS4 may include any of various types of organic/inorganic insulating materials, such as silicon nitride ($SiN_x$), silicon oxide ($SiO_x$), or aluminum oxide ($AlO_x$).

In one embodiment, the fourth insulating layer INS4 may include a thin film encapsulation layer having a multi-layered structure. For example, the fourth insulating layer INS4 may include a thin film encapsulation layer having a multi-layered structure, which includes at least two inorganic insulating layers and at least one organic insulating layer interposed between the at least two inorganic insulating layers. However, the present invention is not limited thereto, and the structural material and/or structure of the fourth insulating layer INS4 may be variously changed. According to embodiments, a color conversion layer and/or a color filter layer may be further formed on the fourth insulating layer INS4, but the present invention is not limited thereto.

According to embodiments of the present invention, a first insulating film is formed in a first area of a light-emitting element, thereby preventing or substantially preventing damage to the first area in a process of etching a second area. Accordingly, surface defects of the light-emitting element can be minimized or reduced, thereby improving the lifetime and efficiency thereof.

Effects of the present disclosure are not limited to the embodiments set forth herein and more diverse effects are included in the present invention.

It will be apparent to those skilled in the art to which the embodiments of the present invention pertain that a variety of modifications are possible without departing from the characteristics of the present invention. Therefore, the above-described aspects and methods shall be interpreted as being illustrative while not being limiting. It should be understood that the scope of the present invention shall be set forth by the appended claims, and all of their equivalents fall within the scope of the present invention.

What is claimed is:

1. A method of manufacturing a light-emitting element, the method comprising:
    forming a light-emitting stack on a stack substrate, the light-emitting stack comprising a lower portion and an upper portion disposed on the lower portion;
    primary etching the upper portion of the light-emitting stack to form first areas of light-emitting patterns;
    surface treating the first areas of the light-emitting patterns so that a first diameter of a first area of the first areas of the light-emitting patterns is constant along a height direction away from the stack substrate;
    forming a first insulating film surrounding the first areas of the light-emitting patterns;
    secondary etching the lower portion of the light-emitting stack to form second areas of the light-emitting patterns, adjacent light-emitting patterns of the light-emitting patterns being spaced apart along an upper surface of the stack substrate, wherein a second diameter of a second area of the second areas of the light-emitting patterns decreases along the height direction and a minimum value of the second diameter is greater than the first diameter; and
    forming a second insulating film surrounding the first area and the second area,
    wherein the upper surface of the stack substrate is completely covered by the lower portion of the light-emitting stack between the adjacent light-emitting patterns during the primary etching.

2. The method of claim 1, wherein the light-emitting stack comprises:
    a first semiconductor layer; a second semiconductor layer on the first semiconductor layer; and
    an active layer between the first semiconductor layer and the second semiconductor layer.

3. The method of claim 2, wherein, in the forming of the first area, the first semiconductor layer and the active layer are etched.

4. The method of claim 3, wherein the first insulating film is formed directly on the first semiconductor layer and the active layer.

* * * * *